United States Patent

Yokosawa et al.

(10) Patent No.: US 10,185,017 B2
(45) Date of Patent: Jan. 22, 2019

(54) MAGNETIC RESONANCE IMAGING APPARATUS APPLYING AN MPG (MOTION PROBING GRADIENT) DURING DIFFUSION WEIGHTED IMAGING

(71) Applicant: Hitachi, Ltd., Tokyo (JP)

(72) Inventors: Suguru Yokosawa, Tokyo (JP); Hisaaki Ochi, Tokyo (JP); Yoshitaka Bito, Tokyo (JP)

(73) Assignee: HITACHI, LTD., Tokyo (JP)

( * ) Notice: Subject to any disclaimer, the term of this patent is extended or adjusted under 35 U.S.C. 154(b) by 1065 days.

(21) Appl. No.: 14/336,144

(22) Filed: Jul. 21, 2014

(65) Prior Publication Data

US 2015/0022210 A1   Jan. 22, 2015

(30) Foreign Application Priority Data

Jul. 22, 2013  (JP) ................................ 2013-151982

(51) Int. Cl.
*G01R 33/563* (2006.01)
*G01R 33/56* (2006.01)

(52) U.S. Cl.
CPC ... *G01R 33/56341* (2013.01); *G01R 33/5608* (2013.01)

(58) Field of Classification Search
USPC ........................ 324/300–322; 600/407–435; 382/128–131
See application file for complete search history.

(56) References Cited

U.S. PATENT DOCUMENTS

| 8,395,386 | B2 * | 3/2013 | Kimura | G01R 33/56341 324/307 |
| 2011/0043206 | A1 * | 2/2011 | Kimura | G01R 33/56341 324/309 |
| 2012/0002851 | A1 * | 1/2012 | Jensen | G01R 33/56341 382/128 |
| 2015/0022210 | A1 * | 1/2015 | Yokosawa | G01R 33/5608 324/318 |

OTHER PUBLICATIONS

Office Action, dated Feb. 16, 2016, which issued during the prosecution of Japanese Patent Application No. 2013-151982, which corresponds to the present application.

(Continued)

*Primary Examiner* — Melissa Koval
*Assistant Examiner* — Tiffany Fetzner
(74) *Attorney, Agent, or Firm* — Baker Botts L.L.P.

(57) ABSTRACT

The present invention provides a technique for obtaining a high-quality image at high speed in DKI analysis. In the DKI analysis, upon estimating a parameter relating to diffusion in an application direction of an MPG pulse, a least square fitting is separated from a constraint processing, and only a value of the pixel that does not meet the constraint condition in the least square fitting is targeted for the correction. Then, with regard to this pixel, a diffusion-related parameter is re-estimated using the pixel value after the correction, and a parameter image is generated by using the diffusion-related parameter thus obtained.

14 Claims, 11 Drawing Sheets

(56) References Cited

OTHER PUBLICATIONS

Y. Masutani et al., "A Method for an Analytic Solution for Diffusion Kurtosis Computation in Diffusion MR Imaging," The Institute of Electronics, Information and Communication Engineers Technical Report, vol. 111, No. 127, Jul. 2011, pp. 11-16 (English translation attached).

Maria F. Falangola, MD, PhD et al. Age-Related Non-Gaussian Diffusion Pattern in the Prefrontal Brain, J. Magn Reson Imaging. , Author Manuscript; available in PMC Apr. 16, 2009, p. 1-12.

Office Action, dated Apr. 18, 2018, which issued during the prosecution of German Patent Application No. 10 2014 214 256.3, which corresponds to the present application (English translation attached).

\* cited by examiner

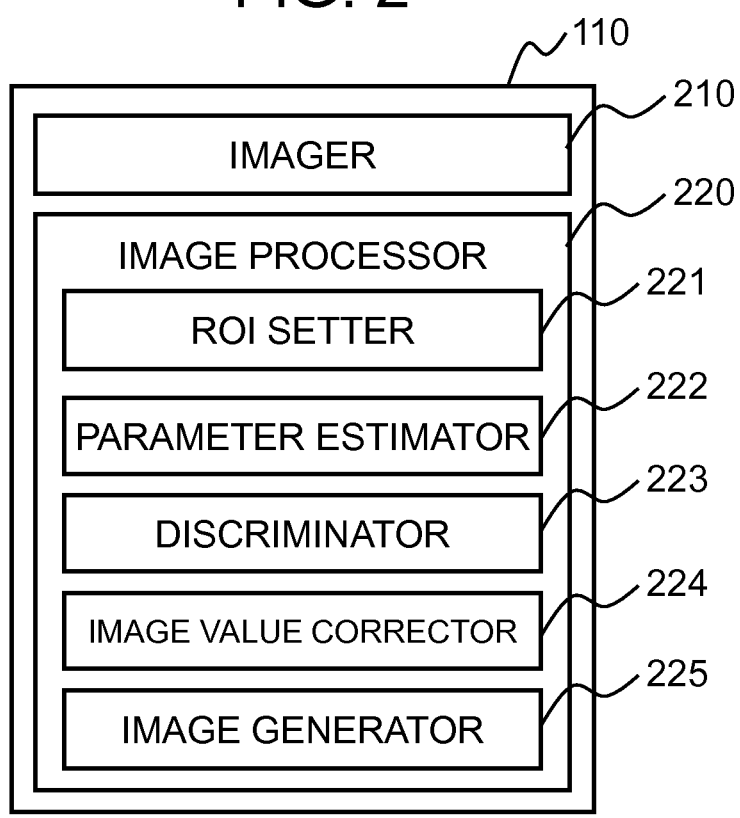

FIG. 3

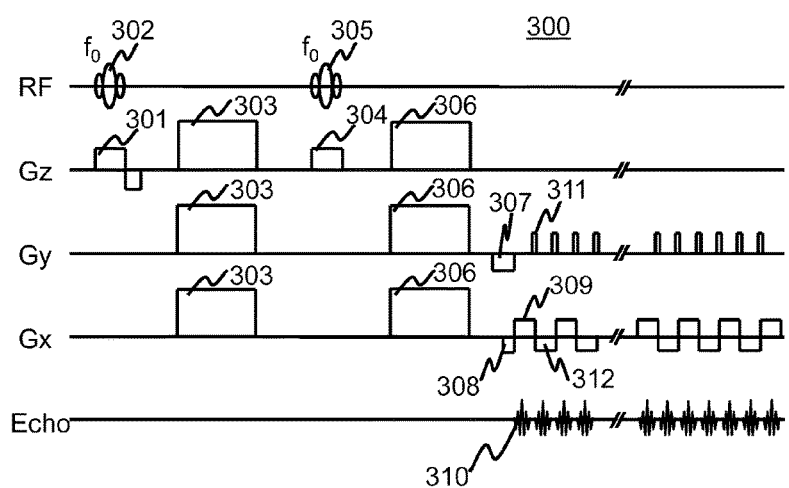

Label Key:
301: Gradient Magnetic Field Pulse
302: RF Pulse
303: Motion Probing Gradient (MPG) Pulse
304: Slice Gradient Magnetic Field Pulse
305: RF Pulse
306: MPG Pulse
307: Phase Encoding Gradient Magnetic Field Pulse
308: Readout Gradient Magnetic Field Pulse for Dephasing
309: Readout Gradient Magnetic Field Pulse
310: Nuclear Magnetic Resonance Signal (echo)
311: Phase Encoding Gradient Magnetic Field Pulse
312: Readout Gradient Magnetic Field Pulse

MAGNETIC RESONANCE IMAGING APPARATUS APPLYING AN MPG (MOTION PROBING GRADIENT) DURING DIFFUSION WEIGHTED IMAGING

INCORPORATION BY REFERENCE

The present application claims priority from Japanese patent application JP-2013-151982 filed on Jul. 22, 2013, the content of which is hereby incorporated by reference into this application.

BACKGROUND OF THE INVENTION

Field of the Invention

The present invention relates to a technique for processing an image acquired by use of a magnetic resonance imaging (hereinafter, referred to as "MRI") apparatus. In particular, the present invention relates to a technique of diffusion kurtosis imaging.

Description of the Related Art

An MRI apparatus is a medical image acquisition system that utilizes mainly nuclear magnetic resonance phenomenon of protons. The MRI apparatus is capable of imaging any cross section noninvasively, and acquiring morphological information, and in addition, information regarding vital functions such as blood flow and metabolic functions. One of important images obtained through the MRI is a diffusion weighted image (DWI). The diffusion weighted image is an image where self-diffusion of water molecules contained in body tissue is weighted. Upon imaging, in order to acquire a signal depending on the diffusion rate, MPG (Motion Probing Gradient) pulses are applied before and after a refocusing radio frequency (RF) pulse, and then echoes are obtained therefrom. Here, the MPG pulse induces reduction of signal intensity due to phase dispersion on a nuclear spin that moves randomly.

Since the nuclear spin that diffuses in the MPG pulse application direction causes the reduction of signal intensity due to the phase dispersion, controlling the MPG pulse application direction allows acquisition of diffusing information in any directions. In addition, a diffusion weighting degree may be adjusted by using diffusion factor (b-value) being a parameter relating to application intensity and application time of the MPG pulse. The higher is the b-value, an image with a higher degree of diffusion weighting is acquired.

There is a technique for measuring a spatial diffusion distribution of water molecules, referred to as DTI (Diffusion Tensor Imaging). In the DTI, it is assumed that the spatial diffusion distribution of water molecules follows a model of three-dimensional elliptic diffusion being a Gaussian distribution, and by calculating its FA (Fractional Anisotropy), a structure of white matter nerve tract is analyzed. Repeating a pulse sequence for acquiring a diffusion weighted image (DWI) with varying the MPG pulse application direction configures a pulse sequence of DTI.

In recent years, as a technique for weighting a restricted degree of diffusion movement by a cell membrane, subcellular organelle, or the like, diffusion kurtosis imaging (DKI) is suggested. The DKI assumes the spatial diffusion distribution of water molecules as a diffusion model of non-Gaussian distribution. It is expected that this technique allows capturing microstructural change along with tissue degeneration and/or cell proliferation, compared to the DTI that assumes the spatial diffusion distribution as a diffusion model of Gaussian distribution. Repeating the DTI pulse sequence with varying the b-value configures a pulse sequence of DKI.

Generally, in analyzing an image obtained through the DKI (hereinafter, referred to as "DKI analysis"), a non-linear least square fitting process is executed for each pixel, in the diffusion weighted images obtained through the pulse sequence with an identical MPG pulse application direction and various b-values, and a diffusion coefficient and a kurtosis coefficient are estimated as the diffusion-related parameter with respect to each MPG pulse application direction (e.g., see "Age-related non-Gaussian diffusion patterns in the prefrontal brain", Falangola M F, Jensen J H, Babb J S, Hu C, Castellanos F X, Martino A D, Ferris S H, and Helpern J A, Journal of Magnetic Resonance Imaging 28, 2008, p. 1345-1350, hereinafter, referred to as "non-patent document 1"). Then, in order to depict a spatial distribution of each coefficient, for instance, components of the diffusion tensor and the kurtosis tensor are calculated so as to obtain the diffusion coefficient, the kurtosis coefficient, and the like, in a first primary component direction or in the direction perpendicular to the primary component.

In order to acquire a high-quality image within a short period of time in the DKI analysis, the challenge is to stabilize and speed-up the non-linear least square fitting in the diffusion-related parameter estimation. In the technique described in the non-patent document 1, a smoothing filter is applied to all over the diffusion weighted image, as a preprocessing, so as to stabilize the calculation. Therefore, the diffusion weighted image as a basis for the diffusion-related parameter estimation may undergo blurring, and this may have an influence on the quality of a resultant parameter image. As a general method for stabilizing the calculation, there is a constrained non-linear least square fitting. If it is constrained, however, an initial value is modified more than once, and it is necessary to repeat the calculation. Therefore, this may extend the processing time.

The present invention has been made in view of the situation described above, and an object of the present invention is to provide a technique for obtaining a high-quality image at high speed in the DKI analysis.

SUMMARY OF THE INVENTION

The present invention is directed to the following; in the DKI analysis, upon estimating a diffusion-related parameter with respect to each MPG pulse application direction, the least square fitting is separated from a constraint processing, and in the least square fitting, only a value of the pixel that does not meet a constraint condition is subjected to correction. With regard to this pixel, the diffusion-related parameter is re-estimated, using the corrected pixel value, and the obtained diffusion-related parameter is used to generate a parameter image.

According to the present invention, it is possible to obtain a high-quality image at high speed in the DKI analysis.

BRIEF DESCRIPTION OF THE DRAWINGS

FIG. 2 is a functional block diagram illustrating the computer of the first embodiment;

FIG. 3 illustrates a pulse sequence for acquiring a diffusion weighted image;

DESCRIPTION OF THE PREFERRED EMBODIMENTS

First Embodiment

Hereinafter, the first embodiment to which the present invention is applied will be explained. Unless otherwise specified, in all the figures for explaining the embodiments of the present invention, constituents having an identical function are labeled the same, and the function shall not be tediously explained.

Firstly, a magnetic resonance imaging (MRI) apparatus of the present embodiment will be explained. In the MRI apparatus 100 of the present embodiment, a slice gradient magnetic field is applied to a test subject placed in a static magnetic field, and simultaneously, a radio frequency (RF) magnetic field having a specific frequency is applied, thereby exciting nuclear magnetization within the slice that is targeted for imaging. Then, a phase encoding gradient magnetic field and a readout gradient magnetic field are applied to the nuclear magnetization being excited, thereby providing planar positional information, and a nuclear magnetic resonance signal (echo) generated by the nuclear magnetization is measured. Measurement of the nuclear magnetic resonance signal is performed repeatedly until filling up the measurement space referred to as k-space, and the signals filled in the k-space are transformed to an image (imaged) using an inverse Fourier transform.

Figure 1:
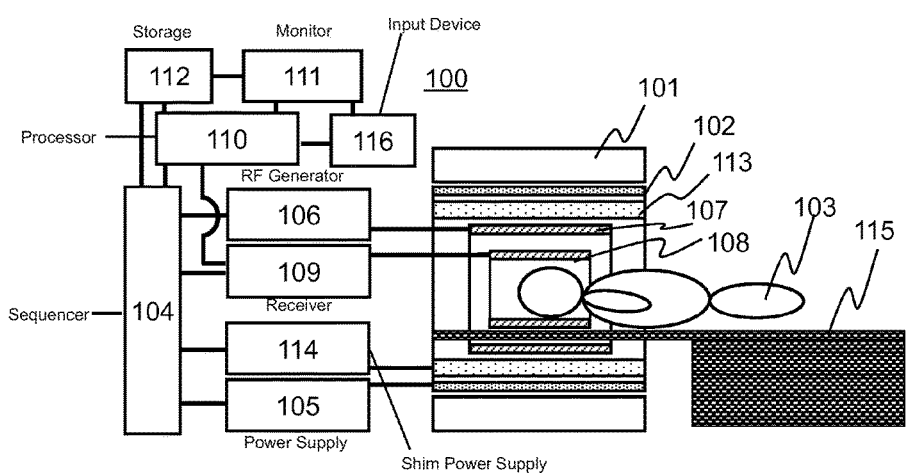
FIG. 1 is a block diagram illustrating the MRI apparatus of the first embodiment.

FIG. 1 is a block diagram illustrating a typical configuration of the MRI apparatus 100 for implementing the foregoing, according to the present embodiment. This MRI apparatus 100 of the present embodiment is provided with a magnet 101 for generating a static magnetic field, a gradient coil 102 for generating a gradient magnetic field, an RF coil 107 for irradiating a test subject (living body) 103 with a radio frequency magnetic field pulse (hereinafter, referred to as "RF pulse"), an RF probe 108 for detecting an echo signal generated from the test subject 103, and a bed (table) 115 for placing the test subject (e.g., living body) 103 within the static magnetic field space generated by the magnet 101.

The MRI apparatus 100 of the present embodiment is further provided with a gradient magnetic field power supply 105 for driving the gradient coil 102, a radio frequency magnetic field generator 106 for driving the RF coil 107, a receiver 109 for receiving the echo signal detected by the RF probe 108, a sequencer 104 for sending a command to the gradient magnetic field power supply 105 and the radio frequency magnetic field generator 106 so as to generate the gradient magnetic field and the radio frequency magnetic field, respectively, together with setting a nuclear magnetic resonance frequency as a detection criteria to the receiver 109, a computer to apply signal processing (arithmetic processing) to the signal being detected, a monitor 111 for displaying a result of the processing performed in the computer 110, a storage 112 for holding the result of the processing, and an input device 116 for accepting an instruction from an operator.

In the MRI apparatus 100 having the configuration as described above, RF pulses are applied to the test subject 103 via the RF coil 107 under the control of the sequencer 104, and further, gradient magnetic field pulses for supplying echo signals with positional information, such as slice selection and phase encoding, are applied via the gradient coil 102. The RF probe 108 receives signals generated from the test subject 103, and the signals being detected are transferred to the computer 110. Then, in the computer, signal processing such as image reconstruction is performed. It is to be noted that the storage 112 may store those signals being detected, imaging conditions, and the like, as appropriate, in addition to a result of the signal processing.

The MRI apparatus 100 may also be provided with a shim coil 113, and a shim power supply 114 for driving the shim coil 113, if it is necessary to adjust a degree of homogeneity of the static magnetic field. The shim coil 113 is made up of more than one channel, and generates additional magnetic field by the current supplied from the shim power supply 114, so as to correct inhomogeneity of the static magnetic field. The sequencer 104 controls the current flowing in each of the channels constituting the shim coil 113, upon adjusting the degree of homogeneity of the static magnetic field.

The computer 110 performs not only the signal processing (arithmetic processing) on the signals being detected, but also controls the entire operation of the MRI apparatus 100. By way of example, the computer provides an instruction to the sequencer 104 so that each part operates at a timing and intensity being programmed in advance, and controls the operation of each part as described above to execute measurement and imaging.

The instruction to the sequencer 104 is provided so that each part operates at a timing and intensity as programmed in advance. Among those programs, a program particularly describing the timing and intensity of the radio frequency magnetic field, the gradient magnetic field, and the signal receiving is referred to as a pulse sequence. Measurement is performed according to the pulse sequence and imaging parameters necessary for controlling the pulse sequence. The pulse sequence is generated in advance and held in the storage 112. An operator inputs the imaging parameters via user interface.

As illustrated in FIG. 2, the computer 110 of the present embodiment is provided with an imager 210 that performs measurement according to the predetermined pulse sequence and reconstructs an image, and an image processor 220 that subjects the image being reconstructed to an arithmetic processing so as to obtain a parameter image. In the present specification, the parameter image is assumed as an image obtained by depicting a spatial distribution of a diffusion coefficient and a kurtosis coefficient, by using mean values of the diffusion coefficient and the kurtosis coefficient calculated for each pixel, a diffusion tensor, a kurtosis tensor, and the like.

Various pulse sequences are known for any purpose. The present embodiment employs, as one of those pulse sequences, a diffusion weighted imaging sequence that applies an MPG (motion probing gradient) pulse for adding signal variation along with the diffusion as a gradient magnetic field, to a nuclear magnetic resonance signal. Specifically, the present embodiment employs a pulse sequence of DKI (DKI pulse sequence). The DKI pulse sequence is a pulse sequence in which a DWI pulse sequence for obtaining a diffusion weighted image is executed repeatedly, with varying the MPG pulse application direction and b-value. The diffusion weighted image is an image obtained by weighting self-diffusion of water molecules contained in body tissue. It is known that the diffusion weighted image allows representation of lesion shortly after onset of acute-stage cerebral infarction, showing contrast being different from T1-weighted image and T2-weighted image.

FIG. 3 illustrates the pulse sequence 300 of ss-DWEPI (single shot Diffusion Weighted Echo Planar Imaging), as one example of the DWI pulse sequence.

Operations of the ss-DWEPI pulse sequence 300 are described in the following. The RF pulse 302 is applied at a resonance frequency $f_0$ of targeted nuclear magnetization, along with applying the gradient magnetic field pulse 301 in the slice direction (z), thereby inducing nuclear magnetic resonance phenomenon in the nuclear magnetization of a certain slice within a targeted object. Next, the MPG pulse 303 for measuring random movement of the nuclear magnetization is applied. On this occasion, a direction targeted for the measurement in the random movement of the nuclear magnetization determines the axis to which the MPG pulse 303 is applied. In FIG. 3, there is shown one example where the MPG pulses are applied in the three axis directions; x-axis, y-axis, and z-axis. However, the application directions are not limited to those directions.

Next, a magnetized refocusing RF pulse 305 at the resonance frequency $f_0$ is applied together with applying the slice gradient magnetic field pulse 304, thereby allowing the magnetization phase to refocus, having been dispersed by inhomogeneity of the static magnetic field. Next, the MPG pulse 306 is applied in the same direction as the MPG pulse application direction 303, so as to perform refocusing of the phase of moveless nuclear magnetization being dispersed by the MPG pulse 303.

Next, after applying a phase encoding gradient magnetic field pulse 307 for adding positional information in the phase encoding direction (y) to the magnetization phase and a readout gradient magnetic field pulse for dephasing 308, a nuclear magnetic resonance signal (echo) 310 is measured, while applying a readout gradient magnetic field pulse 309 for adding positional information in the readout direction (x).

Thereafter, it is repeated to apply the phase encoding gradient magnetic field pulse 311 to change the phase encoding amount, reverse the readout gradient magnetic field pulse 312, and acquire the nuclear magnetic resonance signal (echo) 310. Then, echoes necessary for obtaining one piece of image are acquired. Echoes 310 are arranged in the k-space and subjected to an inverse Fourier transform, so as to reconstruct an image.

The imager 210 of the present embodiment repeatedly executes the aforementioned ss-DWEPI pulse sequence 300 as the DKI pulse sequence, varying the application direction and the b-value of the MPG pulse 303, thereby obtaining plural diffusion weighted images, respectively for the various application directions and b-values of the MPG pulse 303. As described above, the b-value is a parameter that relates to the application intensity and application time of the MPG pulses 303 and 306. Therefore, variations in the b-value change the application intensity or the application time of the MPG pulses 303 and 306.

By way of example, in the case where the MPG pulse application direction varies among different M directions, and the b-value varies among different N values, the imager 210 executes the ss-DWEPI pulse sequence 300, M×N times. In the present embodiment, for example, the application direction of the MPG pulse 303 varies among fifteen or more axes in the different directions. The b-value used here varies among at least three different values (including b=0).

The image processor 220 of the present embodiment estimates apparent diffusion coefficient ADC and apparent kurtosis coefficient AKC from thus obtained plural diffusion weighted images, as diffusion-related parameters (diffusion parameter) for each pixel, and generates a parameter image by using those coefficients. In the present embodiment, upon estimating the diffusion parameter, a non-linear least square fitting process without a constraint condition is performed, instead of performing a non-linear least square fitting process with the constraint condition. Then, only the obtained diffusion parameter that does not satisfy the constraint condition is subjected to pixel value correction, and thereafter, estimation of the diffusion parameter is performed again. In the present specification, the apparent diffusion coefficient ADC and the apparent kurtosis coefficient AKC are simply referred to as "diffusion coefficient ADC" and "kurtosis coefficient AKC", respectively.

As shown in FIG. 2, in order to implement the foregoing, the image processor 220 of the present embodiment is provided with, an ROI setter 221 configured to set a region of interest on the image (diffusion weighted image) being obtained, a parameter estimator 222 configured to use a value of a pixel in the region of interest in plural images (diffusion weighted images) obtained by executing the pulse sequence 300 in an identical application direction of the MPG pulse 303 with varying the b-value, and estimate a diffusion parameter being a diffusion-related parameter, with respect to each pixel, a discriminator 223 configured to make a determination whether or not the diffusion parameter being estimated is within a predetermined range of the constraint condition, a pixel value corrector 224 configured to perform correction on the value of the pixel as to which a result of the determination indicates the diffusion parameter is out of the range, and an image generator 225 configured to generate a parameter image by using the diffusion parameter for each pixel. The parameter estimator 222 estimates the diffusion parameter according to the non-linear least square fitting process without the constraint condition, re-estimates the diffusion parameter by using the pixel value after being corrected, and the image generator 225 uses the re-estimated diffusion parameter for the pixel whose value has been corrected.

Firstly, a flow of the image processing according to each part of the image processor 220 of the present embodiment will be explained. Here, the imager 210 executes the DKI pulse sequence with varying the application direction and the b-value of the MPG pulse 303 so as to obtain plural diffusion weighted images, and further obtains a parameter image from the plural diffusion weighted images.

Figure 4:
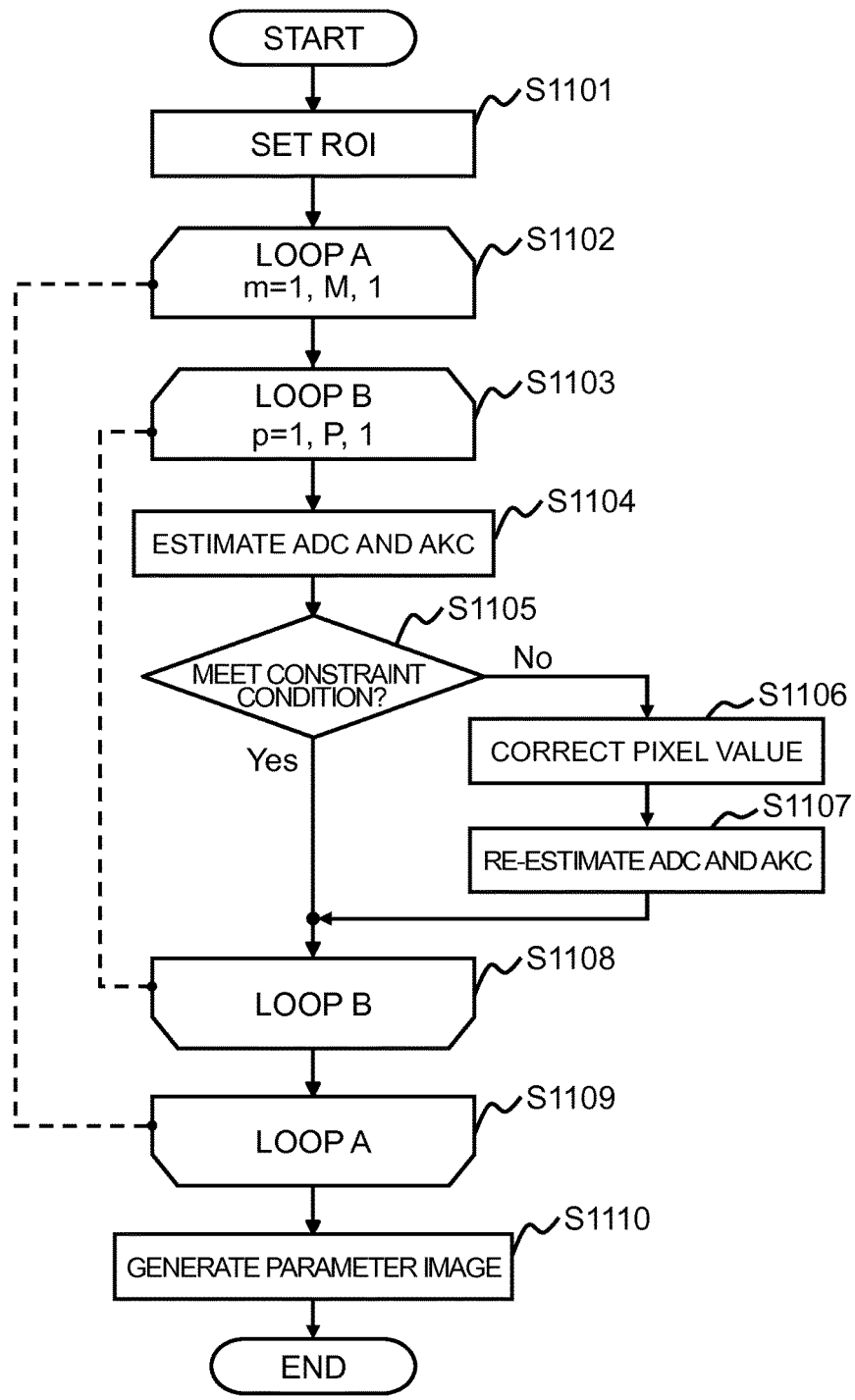
FIG. 4 is a flowchart of image processing of the first embodiment.

FIG. 4 is a flow of the image processing of the present embodiment. It is assumed here that the number of the application directions of the MPG pulse 303 is M, and the number of various b-values is N (M and N are integers at least two, and the same shall apply hereinafter in the present specification). The imager 210 obtains a predetermined number of (here, M×N) diffusion weighted images according to the DKI pulse sequence, and thereafter starts the image processing, upon receipt of an instruction from a user. It is also possible to configure such that the time when the imager 210 receives the predetermined number of diffusion weighted images triggers this image processing.

Firstly, the ROI setter 221 sets a region of interest on the diffusion weighted images being obtained (step S1101). In this example here, the number of the pixels within the region of interest is assumed as P (P is an integer at least one, and the same shall apply hereinafter in the present specification).

Next, each part of the image processor 220 executes the processing from the step S1103 to the step S1107 described below, with respect to each application direction of the MPG pulse 303 at the time of acquisition, as to each pixel in the region of interest of the M×N diffusion weighted images (steps S1102 and S1103).

The parameter estimator 222 uses the pixel value of the pixel p (p is an integer between or equal to 1 and P) of the plural (N) diffusion weighted images with various b-values, in the application direction m (m is an integer between or equal to 1 and M) of the MPG pulse 303 at the time of acquisition, and estimates as the diffusion parameter, the diffusion coefficient ADC and the kurtosis coefficient AKC of the pixel p (step S1104). Next, the discriminator 223 determines whether or not the diffusion parameter being estimated meets the predetermined constraint condition (step S1105).

In the case where the diffusion parameter being estimated does not meet the constraint condition, the pixel value corrector 224 corrects the value of the pertinent pixel p of the N diffusion weighted images (step S1106), and the parameter estimator 222 uses thus corrected pixel value to re-estimate the diffusion parameter (the diffusion coefficient ADC and the kurtosis coefficient AKC) of the pixel p (step S1107).

Upon completion of estimating the diffusion parameter of the pixel p as to the entire region of interest, with respect to each application direction of the MPG pulse 303 (steps S1108 and S1109), the image generator 225 generates a parameter image such as a mean diffusivity image and a mean kurtosis image, using the diffusion parameter estimated for each pixel in each application direction of the MPG pulse 303 (step S1110).

It is alternatively possible that before the step S1102, the pixel value corrector 224 subjects the value of each pixel in the region of interest of all the diffusion weighted images, to the correction process performed in the step S1106, and the storage 112 may store the values. In this instance, the corrected value of the pixel is reloaded from the storage 112, without performing the correction process in the step S1106.

Next, processing of each part described above will be explained.

Firstly, a method for setting a region of interest according to the ROI setter 221 will be explained. The region of interest is a region made up of pixels targeted for subsequent image processing operation. In other words, it is a region other than a portion of the background in the diffusion weighted image. The ROI setter 221 specifies a pixel to be extracted as the region of interest according to a discriminant analysis method, or the like, for instance. Specifically, the ROI setter obtains a threshold that maximizes a degree of separation, and extracts as the region of interest, a pixel having a value equal to or higher than the threshold. It is further possible to configure such that the operator designates the threshold or the region of interest itself, via an interface.

A method of calculating the diffusion parameter in the parameter estimator 222 will be explained. As described above, the diffusion parameter to be calculated includes the diffusion coefficient ADC and the kurtosis coefficient AKC.

It is assumed here that the number of the application directions of the MPG pulse 303 is M, and those application directions are serially numbered. When the MPG pulse 303 is applied in the m-th application direction, the MPG pulse application direction 303 is referred to as "m". The number of the b-values is assumed as N.

When the application direction of the MPG pulse 303 is assumed as m, and the b-value is assumed as "b", in the DKI analysis, the formula (1) expresses signal intensity S(m, b) of a certain pixel in the diffusion weighted image:

$$S(m, b) = S_0 \cdot \text{Exp}\left(-b \cdot ADC_m + \frac{1}{6} b^2 \cdot ADC_m^2 \cdot AKC_m\right) \quad (1)$$

Here, "$S_0$" represents the signal intensity (=S(m, 0)) when the b-value is 0, "$ADC_m$" represents the diffusion coefficient in the application direction m, "$AKC_m$" represents the kurtosis coefficient in the application direction m.

The parameter estimator 222 estimates the diffusion coefficient $ADC_m$ and the kurtosis coefficient $AKC_m$ of the pertinent pixel, using the values of the pixel in N diffusion weighted images, according to the non-linear least square fitting without the constraint condition, such as the quasi-Newton method and the Levenberg-Marquardt method. Those N diffusion weighted images are obtained by applying the MPG pulses 303 with various b-values in an identical application direction.

The discriminator 223 determines whether or not the estimated diffusion parameter (diffusion coefficient $ADC_m$ and kurtosis coefficient $AKC_m$) satisfies the constraint condition. The constraint condition is determined for each diffusion parameter, within its value range. The range of the constraint condition is predetermined, and the storage 112 stores the range of the constraint condition. By way of example, the diffusion coefficient $ADC_m$ may have the range equal to or larger than 0 ($0 \leq ADC_m$), and the kurtosis coefficient $AKC_m$ may have the range between or equal to 0 and 3 ($0 \leq AKC_m \leq 3$), and the like.

This is because the diffusion coefficient $ADC_m$ and the kurtosis coefficient $AKC_m$ are physically defined as being in the ranges; $0 \leq ADC_m$ and $-2 \leq AKC_m \leq 3$, respectively. Therefore, existence of a value smaller than zero as the diffusion coefficient $ADC_m$ is physically impossible. As for the kurtosis coefficient $AKC_m$, neither existence of a value smaller than −2 nor existence of a value larger than 3 is physically possible.

In addition, as for the kurtosis coefficient $AKC_m$, if a diffusion model of the signal intensity (pixel value) S(m, b) of a certain pixel is assumed as a model following a Gaussian distribution that is expressed by the formula (2), there is a phenomenon that the diffusion coefficient $ADC_m$ is reduced, with the increase of the b-value.

$$S(m,b) = S_0 \cdot \text{Exp}(-b \cdot ADC_m) \quad (2)$$

This is because, in the tissue having a diffusion rate equal to or higher than a certain value, when the b-value becomes larger, phase dispersion of nuclear magnetization is saturated, and there is no further reduction of the signal intensity. Therefore, it is conceivable that the range of $-2 \leq AKC_m < 0$ indicates the state that the diffusion coefficient $ADC_m$ increases with the increase of the b-value is not included in the kurtosis coefficient $AKC_m$ range. Accordingly, the aforementioned ranges may be defined as the value ranges (constraint condition) that the diffusion coefficient $ADC_m$ and the kurtosis coefficient $AKC_m$ are required to satisfy, respectively.

A process for correcting the pixel value in the pixel value corrector 224 will be explained. A smoothing filter may be used for the correction, for instance. In the present embodiment, the correction is performed by applying the smoothing filter, using a value of a pixel within a predetermined range in proximity to the targeted pixel. The smoothing filter to be employed may be a Gaussian Filter, a bilateral filter, a median filter, or the like, for instance. Alternatively, a low-pass filter used in the k-space, or Fermi Filter may be employed.

Next, one example of the process for generating a parameter image in the image generator 225 will be explained. By using the diffusion coefficient $ADC_m$ and the kurtosis coefficient $AKC_m$ being estimated for each pixel, the image generator 225 of the present embodiment calculates according to the following method, a mean diffusion, a mean kurtosis, a kurtosis in the axis direction, and a kurtosis in the radial direction, thereby generating an image as the parameter image having those calculated values as pixel values, respectively.

When the application direction of the MPG pulse 303 is assumed as m, and elements in the second order diffusion tensor D and the fourth order kurtosis tensor W are assumed respectively as $D_{ij}$ and $W_{ijkl}$, the diffusion coefficient $ADC_m$ and the kurtosis coefficient $AKC_m$ are expressed by the following formulas (3) and (4).

$$ADC_m = \sum_{i=1}^{3}\sum_{j=1}^{3} n_i \cdot n_j \cdot D_{ij} \qquad (3)$$

$$AKC_m = \frac{MD^2}{ADC_m^2} \sum_{i=1}^{3}\sum_{j=1}^{3}\sum_{k=1}^{3}\sum_{l=1}^{3} n_i \cdot n_j \cdot n_k \cdot n_l \cdot W_{ijkl} \qquad (4)$$

Here, the MD (Mean Diffusivity) indicates the mean diffusion. This MD is defined as the following formula (5), when eigenvalues in the diffusion tensor D are assumed as $\lambda_1$, $\lambda_2$, and $\lambda_3$ ($\lambda_1 > \lambda_2 > \lambda_3$).

$$MD = \frac{\lambda_1 + \lambda_2 + \lambda_3}{3} \qquad (5)$$

The number of application axes of the MPG pulse 303 is assumed as M and eigenvectors of the diffusion tensor D are assumed as ($e_1$, $e_2$, $e_3$), and when $W^T_{ijkl}$, $G_1$, $G_2$ are defined respectively in the formulas (6), (7), and (8), the mean kurtosis MK (Mean Kurtosis), the kurtosis in the axis direction $K_A$ (Axial Kurtosis), and the kurtosis in the radial direction $K_R$ (Radial Kurtosis) are expressed by the following formulas (9), (10), and (11), respectively.

$$W^T_{ijkl} = \sum_{i'=1}^{3}\sum_{j'=1}^{3}\sum_{k'=1}^{3}\sum_{l'=1}^{3} e_{i'i} \cdot e_{j'j} \cdot e_{k'k} \cdot e_{l'l} \cdot W_{i'j'k'l'} \qquad (6)$$

$$G_1(\lambda_1, \lambda_2, \lambda_3) = \frac{(\lambda_1 + \lambda_2 + \lambda_3)^2}{18\lambda_2(\lambda_2 - \lambda_3)^2}\left(2\lambda_2 + \frac{\lambda_3^2 - 3\lambda_2\lambda_3}{\sqrt{\lambda_2\lambda_3}}\right) \qquad (7)$$

$$G_2(\lambda_1, \lambda_2, \lambda_3) = \frac{(\lambda_1 + \lambda_2 + \lambda_3)^2}{3(\lambda_2 - \lambda_3)^2}\left(\frac{\lambda_2 + \lambda_3}{\sqrt{\lambda_2\lambda_3}} - 2\right) \qquad (8)$$

$$MK = \frac{1}{M}\sum_{i=1}^{M}(AKC)_i \qquad (9)$$

$$K_A = \frac{(\lambda_1 + \lambda_2 + \lambda_3)}{9\lambda_1^2} \cdot W^T_{1111} \qquad (10)$$

$$K_R = G_1 \cdot (\lambda_1, \lambda_2, \lambda_3) \cdot W^T_{2222} + \\ G_1 \cdot (\lambda_1, \lambda_3, \lambda_2) \cdot W^T_{3333} + G_2 \cdot (\lambda_1, \lambda_2, \lambda_3) \cdot W^T_{2233} \qquad (11)$$

It is to be noted here that methods for calculating the mean kurtosis MK (Mean Kurtosis), the kurtosis in the axis direction $K_A$ (Axial Kurtosis), and the kurtosis in the radial direction $K_R$ (Radial Kurtosis) are not limited to those described above.

In the image generator 225 of the present embodiment, the aforementioned parameter estimator 222 uses the diffusion parameter (diffusion coefficient ADC and the kurtosis coefficient AKC) estimated for each pixel with respect to each of M application directions of the MPG pulse 303, and calculates components of each tensor, according to the formulas (3) and (4). The tensor components are calculated by generating simultaneous equations and performing computations by obtaining an inverse matrix. On this occasion, the diffusion parameter re-estimated in the step S1107 is used for the pixel determined as being out of the range in the step S1105.

Next, the mean diffusion, the mean kurtosis, the axial kurtosis, and the radial kurtosis are calculated by the aforementioned formulas (5), (9), (10), and (11), and images using the respective values as pixel values are generated as parameter images.

Those parameter images are transferred to the monitor 111 and presented to the operator.

The computer 110 of the present embodiment is provided with a CPU, a memory, a storage, and the like, and the CPU loads the programs stored in the storage into the memory and executes the programs, so as to implement each of the functions described above. All the functions or a part thereof may be implemented by a general-purpose information processor that is installed separately from the MRI apparatus 100, the information processor being capable of transmitting data to and receiving data from the MRI apparatus 100. In particular, the image processor 220 may be independent as an image processing apparatus.

As described above, the MRI apparatus 100 of the present embodiment is provided with, an imager 210 configured to perform measurement according to a predetermined pulse sequence and reconstruct an image, and an image processor 220 configured to subject the image being reconstructed to an arithmetic processing and obtain a parameter image, the pulse sequence being a diffusion weighted imaging sequence that applies an MPG (motion probing gradient) pulse 303 so as to add signal variation along with diffusion as a gradient magnetic field, to a nuclear magnetic resonance, wherein, the imager 210 executes the pulse sequence with varying the application direction and the b-value of the MPG pulse 303 and acquires plural images, and the image processor 220 is provided with an ROI setter 221 configured to set a region of interest on the image, a parameter estimator 222 configured to estimate a diffusion parameter being a diffusion-related parameter with respect to each pixel, by using a value of a pixel in the region of interest of the plural images obtained by executing the pulse sequence, setting the application direction of the MPG pulse 303 to be identical and varying the b-value, a discriminator 223 configured to make a determination whether or not the diffusion parameter being estimated is within a predetermined range, a pixel value corrector 224 configured to perform correction on the value of the pixel as to which a result of the determination indicates the diffusion parameter is out of the range, and an image generator 225 configured to generate a parameter image by using the diffusion parameter for each pixel, wherein the parameter estimator 222 estimates the diffusion parameter according to a least square fitting without the constraint condition, and re-estimates the diffusion parameter by using the value of the pixel after the correction, and the image generator 225 applies the diffusion parameter being re-estimated to the pixel after the correction. A model function of the least square fitting is assumed as a non-linear function.

In other words, according to the present embodiment, by using plural diffusion weighted images obtained through the DKI pulse sequence, the diffusion coefficient and the kurtosis coefficient are estimated according to the non-linear least square fitting without the constraint condition. Then, only a pixel whose value is calculated as being out of the predetermined constraint condition, is subjected to correction via the smoothing filter or the like, and the diffusion coefficient and the kurtosis coefficient are re-estimated. Only the pixel that is out of the constraint condition range is determined as influenced by a measurement error due to deterioration of an S/N ratio, or the like, in the obtained measurement data.

As described above, in the method of the present embodiment, the pixel subjected to the correction process such as smoothing process is more limited, compared to a conventional method where the smoothing filter is applied to the values of all the pixels in the region of interest. Therefore, occurrence of blurring in the parameter image is restrained while maintaining precision, and this may enhance the image quality of the obtained parameter image.

Since the diffusion parameter is estimated according to the non-linear least square fitting without the constraint condition, the number of times the initial value varies is minimized, compared to the method using the non-linear least square fitting with the constraint condition, and this may increase the speed of calculation.

Therefore, according to the present embodiment, in the DKI analysis, blurring occurrence is restrained in the obtained image, and the calculation speed is enhanced.

Upon performing the re-estimation in the step S1107, any non-linear least square fitting may be used, with or without the constraint condition. When the non-linear least square fitting with the constraint condition is used, the constraint condition being predetermined for each coefficient of the diffusion parameter may be employed as described above.

When the non-linear least square fitting with the constraint condition is performed, the diffusion parameter estimated in the step S1104 may be used as the initial value. The configuration as described above may allow setting of an appropriate initial value in the non-linear least square fitting. Therefore, this may bring the calculation to an end quickly.

Second Embodiment

Next, a second embodiment of the present invention will be explained. In the first embodiment, the diffusion coefficient and the kurtosis coefficient are calculated according to the non-linear least square fitting without the constraint condition. In the present embodiment, the processing of this non-linear least square fitting is improved, and the diffusion coefficient and the kurtosis coefficient are calculated at a higher speed.

The MRI apparatus of the present embodiment has basically the same configuration as the MRI apparatus 100 of the first embodiment. However, as described above, the second embodiment is different from the first embodiment in the calculation method for estimating the parameter. Therefore, a processing of the parameter estimator 222 is also different. Hereinafter, the present embodiment will be explained, focusing on the configuration that is different from the first embodiment.

The parameter estimator 222 of the present embodiment estimates the diffusion coefficient $ADC_m$ and the kurtosis coefficient $AKC_m$ of the pixel, according to the least square fitting, using values of the pixels of N diffusion weighted images that are obtained through the pulse sequence having an identical application direction of the MPG pulse 303 and various b-values. On this occasion, an approximate function (model function) is assumed as a direct function (linear function). In other words, according to the linear least square fitting, each coefficient is estimated.

An approximate linear function is generated according to the following; plural pairs of pixel values of predetermined pixels in plural diffusion weighted images obtained via the pulse sequence in an identical application direction of the MPG pulse 303 with various b-values. By using plural pairs being generated, a linear function is generated representing variation in the value of the pixel, caused by the b-value.

Figure 5:
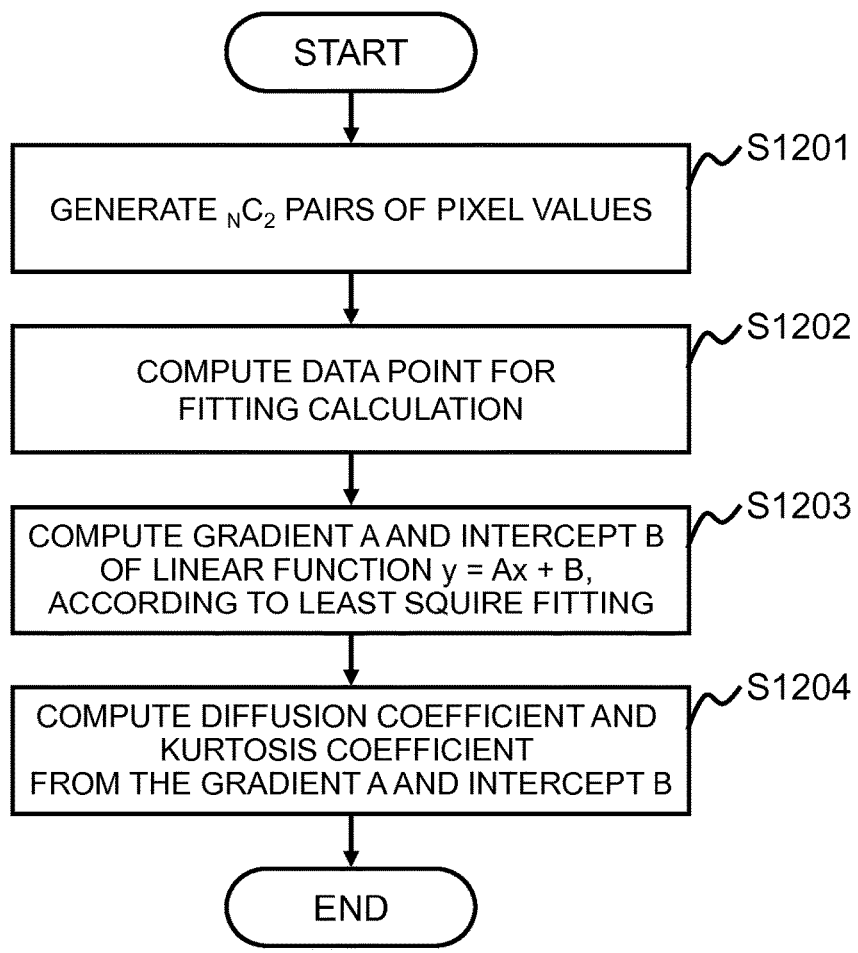
FIG. 5 is a flowchart of parameter estimation processing of the second embodiment.

FIG. 5 illustrates a processing flow of the parameter estimation process performed by the parameter estimator 222 of the present embodiment. Here, the number of the application directions of the MPG pulse 303 is assumed as M, and the number of the various b-values is assumed as N. Similar to the first embodiment, it is also assumed that the application directions are serially numbered, and N b-values are assumed as $b_n$ (n=1, 2 . . . N, and if b=0 exists, it is included).

The pulse sequence is executed assuming that the application direction of the MPG pulse 303 is "m" and the b-value is "$b_n$", and signal intensity of a certain pixel of the diffusion weighted image being obtained is assumed as $S(m, b_n)$ (n=1, 2 . . . N). The parameter estimator 222 of the present embodiment performs the following processing on each pixel. In the following, the diffusion weighted image obtained by executing the pulse sequence assuming the application direction of the MPG pulse 303 as "m" and the b-value as "$b_n$" is referred to as the diffusion weighted image having the application direction m and the b-value $b_n$ of the MPG pulse 303.

Firstly, the parameter estimator 222 generates $_NC_2$ pairs of pixel values, among predetermined pixels p in the N diffusion weighted images in the application direction m of the MPG pulse 303 (step S1201).

The formula (1) may be modified to the following formula (12), by using one pair of pixel values (signal intensity (pixel value) $S(m, b_s)$ when the b-value is $b_s$, and signal intensity (pixel value) $S(m, b_t)$ when the b-value is $b_t$).

$$-\frac{\text{Log}[S(m, b_s)/S(m, b_t)]}{b_s - b_t} = -\frac{1}{6}ADC_m^2 \cdot AKC_m \cdot (b_s + b_t) + ADC_m \quad (12)$$

$$(b_s \neq b_t)$$

In the present embodiment, the linear function expressed by the formula (12) is assumed as the model function used for the least square fitting. According to the formula (12), data point (x, y), the gradient A, and the intercept B in the linear function y=Ax+B are expressed by the following formula (13) to formula (16).

$$x = (b_s + b_t) \quad (13)$$

$$y = -\frac{\text{Log}[S(m, b_s)/S(m, b_t)]}{b_s - b_t} \quad (14)$$

$$A = -\frac{1}{6}ADC_m^2 \cdot AKC_m \quad (15)$$

$$B = ADC_m \quad (16)$$

The parameter estimator 222 uses $_NC_2$ pairs of pixel values being generated, to calculate data points $(x_k, y_k)$ (k=1, 2 ... $_NC_2$) for the fitting calculation according to the formula (13) and the formula (14) (step S1202).

Next, the parameter estimator 222 calculates the gradient A and the intercept B, according to the formula (17) and the formula (18) (step S1203).

$$A = \frac{{}_NC_2 \sum_{k=1}^{NC_2} x_k \cdot y_k - \sum_{k=1}^{NC_2} x_k \cdot \sum_{k=1}^{NC_2} y_k}{{}_NC_2 \sum_{k=1}^{NC_2} x_k^2 - \left(\sum_{k=1}^{NC_2} x_k\right)^2} \quad (17)$$

$$B = \frac{\sum_{k=1}^{NC_2} x_k \cdot \sum_{k=1}^{NC_2} y_k - \sum_{k=1}^{NC_2} x_k \cdot y_k \cdot \sum_{k=1}^{NC_2} x_k}{{}_NC_2 \sum_{k=1}^{NC_2} x_k^2 - \left(\sum_{k=1}^{NC_2} x_k\right)^2} \quad (18)$$

Then, the parameter estimator 222 substitutes values of the gradient A and the intercept B obtained according to the formula (17) and the formula (18), into the formula (15) and the formula (16), and then, calculates the diffusion coefficient $ADC_m$ and the kurtosis coefficient $AKC_m$ (step S1204).

It is to be noted here that a flow of the image processing according to the image processor 220 of the present embodiment is the same as the first embodiment, except the estimating process by the parameter estimator 222 of the step S1104. In the present embodiment, upon re-estimation using the corrected pixel value in the step S1107, any least square fitting is applicable; the linear least square fitting as described above or the non-linear least square fitting. In addition, in the non-linear least square fitting, it does not matter whether the constraint condition is provided or not.

As explained above, similar to the first embodiment, the MRI apparatus of the present embodiment is provided with the imager 210 configured to execute the diffusion weighted imaging sequence with varying the application direction and the b-value of the MPG pulse 303 and obtain plural diffusion weighted images, and an image processor 220, wherein the image processor 220 is provided with an ROI setter 221, a parameter estimator 222, a discriminator 223, a pixel value corrector 224, and an image generator 225. The model function used by the parameter estimator 222 as the least square fitting of the present embodiment is assumed as the linear function.

Therefore, according to the present embodiment, similar to the first embodiment, the correction process is applied only to the pixel the diffusion parameter (diffusion coefficient and kurtosis coefficient) of which is estimated as not meeting the constraint condition, and therefore, it is possible to obtain a high quality parameter image.

The non-linear least square fitting requires repetitive computation. On the other hand, the linear least square fitting does not require the repetitive computation. In the present embodiment, the parameter (diffusion coefficient and kurtosis coefficient) is estimated according to the linear least square fitting that does not require the repetitive computation. Therefore, this enables higher speed computations. This may increase the speed for presenting the parameter image to the operator, enhancing the operability.

It is to be noted, for example, when the diffusion weight image obtained by the imager 210 shows a favorable S/N ratio, it is possible to skip the determination process in the step S1105 in the image processing performed by the image processor 220. In other words, initially, a pixel on which the image processing is to be executed is determined in the diffusion weighted images measured in the ROI setter 221. Then, the parameter estimator 222 calculates, according to the aforementioned method, the diffusion coefficient and the kurtosis coefficient from the pixel value, as to each MPG pulse application direction. Finally, the image generator 225 generates a parameter image such as a mean diffusivity image and a mean kurtosis image, using the estimated diffusion coefficient and kurtosis coefficient. On this occasion, the correction process is not performed, and the smoothing filter is not used. Therefore, this may produce an effect that the calculations are completed at much higher speed.

Also in the present embodiment, in the step S1107, upon executing the non-linear least square fitting with the constraint condition, the diffusion parameter estimated in the step S1104 may be used as the initial value. In the step S1107, the linear least square fitting is employed in the present embodiment and a value close to a true value is obtained as the initial value at high speed. Therefore, even though the non-linear least square fitting used upon re-estimation, high-speed computations are possible.

On this occasion, with skipping the determination process in the step S1105, the non-linear least square fitting with the constraint condition of the step S1107 may be executed for all the pixels, using the diffusion parameter estimated in the step S1104 as the initial value. This configuration may reduce the repetitive computations and achieve higher speed calculations, compared to the case where the non-linear least square fitting with the constraint condition is used without setting the initial value as conventionally performed.

Third Embodiment

Next, a third embodiment of the present invention will be explained. In the present embodiment, similar to the second embodiment, the diffusion parameter is estimated according to the linear least square fitting. In the second embodiment, the value of the pixel that is determined as being out of the range of the constraint condition is corrected by the smoothing filter, or the like. In the present embodiment, correction is made by removing (eliminating) the pixel value that renders the gradient of the fitting function to be significantly large.

The MRI apparatus of the present embodiment has basically the same configuration as the second embodiment. However, as described above, since the correction process performed on the value of the pixel that is determined as not meeting the constraint condition is different, the process in the pixel value corrector 224 is different. Hereinafter, focusing on the configuration different from the second embodiment, the present embodiment will be explained.

As described above, the pixel value corrector 224 of the present embodiment removes (eliminates) the data that significantly contributes to rendering the gradient A of the linear function to be large, the linear function being used in the least square fitting. In the DKI analysis, when the discriminator 223 determines whether the constraint condition is satisfied or not, it is determined as being out of the range of the constraint condition, relatively frequently, when the kurtosis coefficient $AKC_m$ becomes a negative value ($AKC_m < 0$). In view of this, in the present embodiment, a processing to specify and remove such value of the pixel being out of the range is executed, as the correction process performed by the pixel value corrector 224. A target for the removal is a data point that contributes to rendering the kurtosis coefficient $AKC_m$ to be a negative value, when the parameter estimator 222 estimates the parameter.

Figure 6:
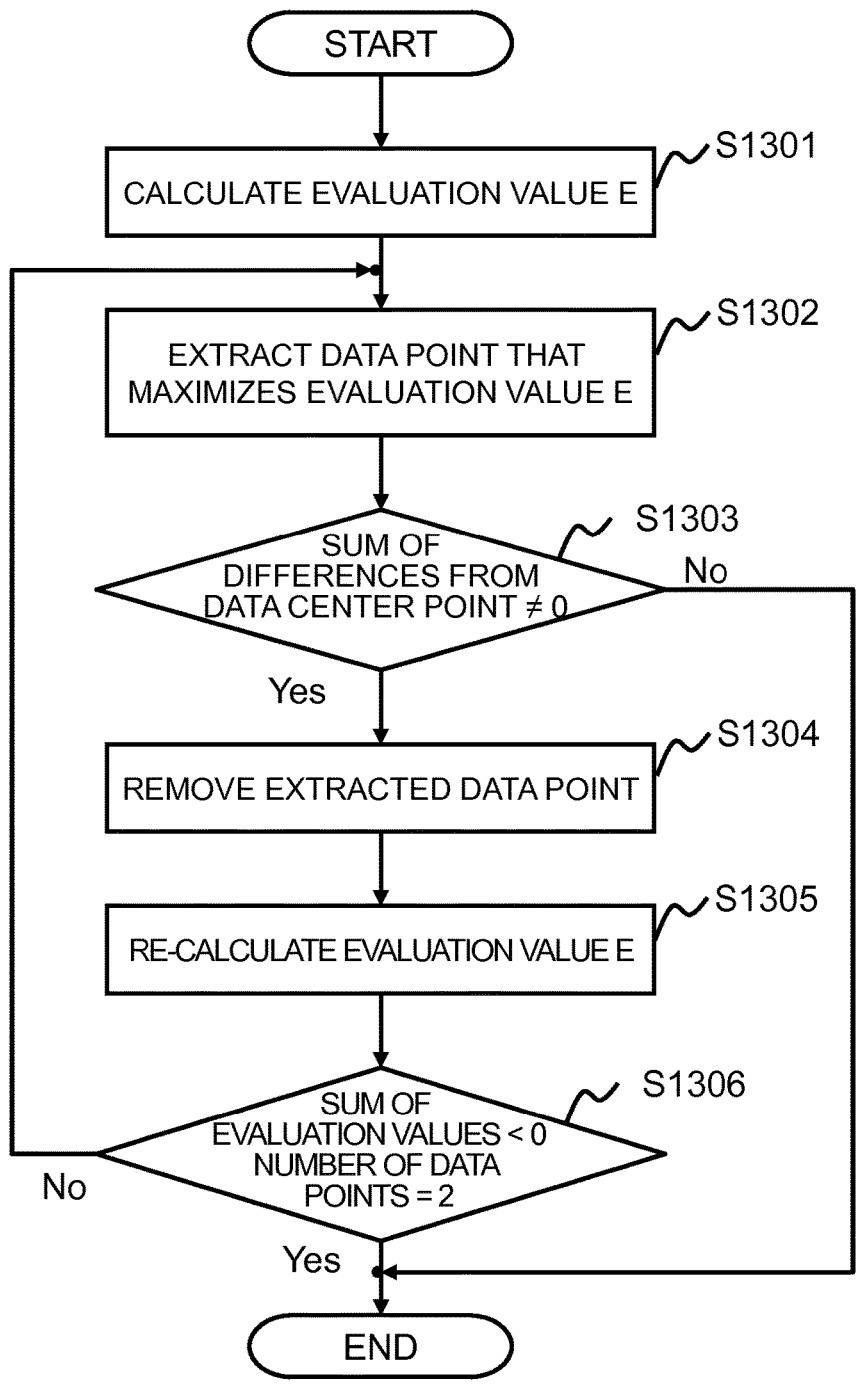
FIG. 6 is a flowchart of pixel value correction processing of the third embodiment.

Hereinafter, the correction process according to the pixel value corrector 224 of the present embodiment will be explained. FIG. 6 illustrates a flow of correction process according to the pixel value corrector 224 of the present embodiment.

Initially, by using the data point (x, y) calculated for the linear least square fitting, an estimation value E is calculated according to the following formula (19) (step S1301).

$$E=(x-x_0)\cdot(y-y_0) \qquad (19)$$

The evaluation value E is an inner product of difference between the data point (x, y) and a center point $(x_0, y_0)$ being a mean value $x_0$ of the x-value and a mean value $y_0$ of the y-value of each data point. This evaluation value E may serve as an index of influence exerted by the data point (x, y) on the gradient of the linear function used for the fitting, in the linear least square fitting of the parameter estimation process in the second embodiment.

According to the formula (15), when the gradient A is equal to or smaller than 0 (A≤0), the kurtosis coefficient $AKC_m$ becomes equal to 0 or larger ($AKC_m$≥0). If the evaluation value E expressed by the formula (19) is large, it is highly possible that the kurtosis coefficient $AKC_m$ becomes negative ($AKC_m$<0). Therefore in this case here, data points that maximize the evaluation value E are extracted (step S1302).

Next, a conditional processing is performed by using the sum of the differences between the respective data points and the center data point $(x_0, y_0)$ (step S1303). Here, it is determined whether the sum becomes zero or not. If the sum becomes zero, the correction process is terminated.

In the step S1303, when the sum is not zero, the extracted data point is removed (step S1304), and the evaluation value E is recalculated according to the remaining data points (step S1305).

The removing process (processing from the step S1302 to the step S1305) is repeated until the sum of the evaluation value E becomes negative (the sum <0), or until the number of data points becomes the minimum (=2) necessary for the calculation (step S1306). When the condition of the step S1306 is satisfied, the removing process is terminated.

It is to be noted that image processing according to the image processor 220, other than the correction process by the pixel value corrector 224, is the same as the second embodiment. In other words, the image processor 220 calculates the diffusion coefficient $ADC_m$ and the kurtosis coefficient $AKC_m$ by using the linear least square fitting, from the plural diffusion weighted images obtained by the imager 210 that executes the DKI pulse sequence. Then, the image processor 220 determines whether or not the calculation result meets the constraint condition, performs the correction process on the value of the pixel being out of the range of the condition, so as to remove the pixel value that renders the kurtosis coefficient $AKC_m$ to be negative. Then, the image processor re-estimates the diffusion coefficient $ADC_m$ and the kurtosis coefficient $AKC_m$ on the data points after the removal. Thereafter, the image processor generates a parameter image from the finally obtained diffusion coefficient $ADC_m$ and the kurtosis coefficient $AKC_m$.

As explained above, similar to the second embodiment, the MRI apparatus of the present embodiment is provided with the imager 210 configured to execute the diffusion weighted imaging sequence, while varying the application direction and the b-value of the MPG pulse 303 so as to obtain plural diffusion weighted images, and the image processor 220, wherein, the image processor 220 is provided with the ROI setter 221, the parameter estimator 222, the discriminator 223, the pixel value corrector 224, and the image generator 225. A model function that the parameter estimator 222 of the present embodiment uses for the least square fitting is assumed as the linear function. On this occasion, the pixel value corrector 224 removes a pixel whose diffusion parameter is out of the range of the constraint condition, so as to correct the pixel value.

As described above, according to the present embodiment, the linear least square fitting is used for estimating the parameter. Therefore, similar to the second embodiment, it is possible to obtain a high-quality parameter image at high speed. Furthermore, in the present embodiment, since the smoothing filter is not used in the correction process, occurrence of blurring caused by the smoothing filter may be restrained. This may provide a much higher quality image in the DKI analysis.

Fourth Embodiment

Next, a fourth embodiment of the present invention will be explained. In the present embodiment, after correcting the value of the pixel that is determined as out of the range of the constraint condition, the re-estimated parameter is also subjected to the determination whether or not the parameter meets the constraint condition. If it does not meet the constraint condition, the parameter itself is corrected.

Figure 7:
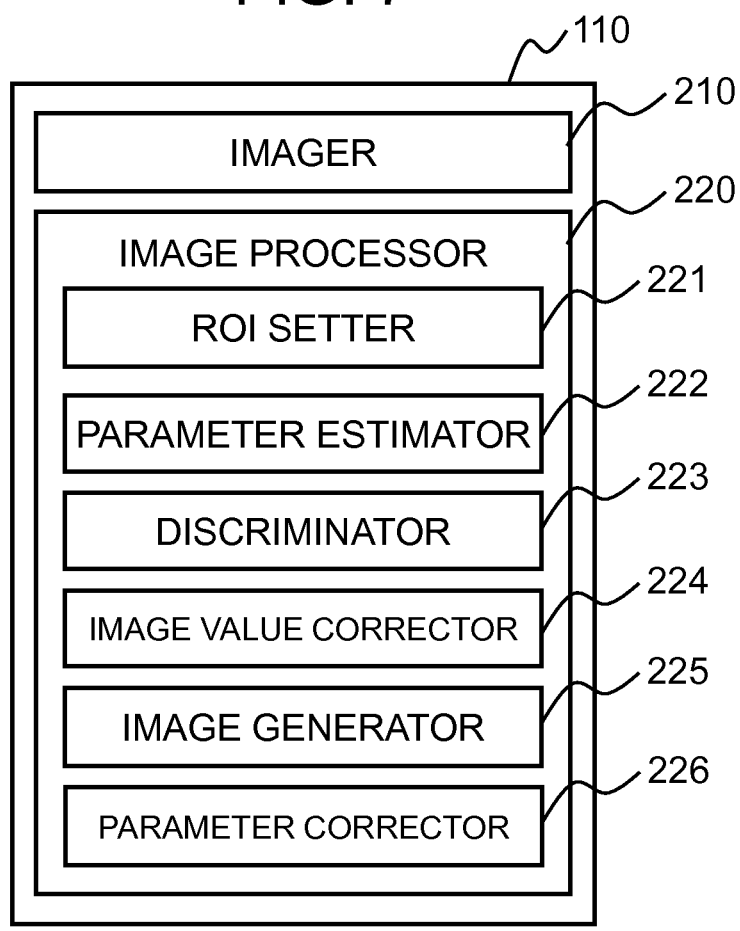
FIG. 7 is a functional block diagram of the computer of the fourth embodiment.

The MRI apparatus of the present embodiment has basically the same configuration as the MRI apparatus 100 of the first embodiment. In order to perform the parameter correction process, as illustrated in FIG. 7, the image processor 220 of the present embodiment is provided with a parameter corrector 226, in addition to the configuration of the first embodiment. The discriminator 223 further determines whether or not the parameter meets the constraint condition, every time the parameter is estimated. Hereinafter, focusing on the configuration different from the first embodiment, the present embodiment will be explained.

Figure 8:
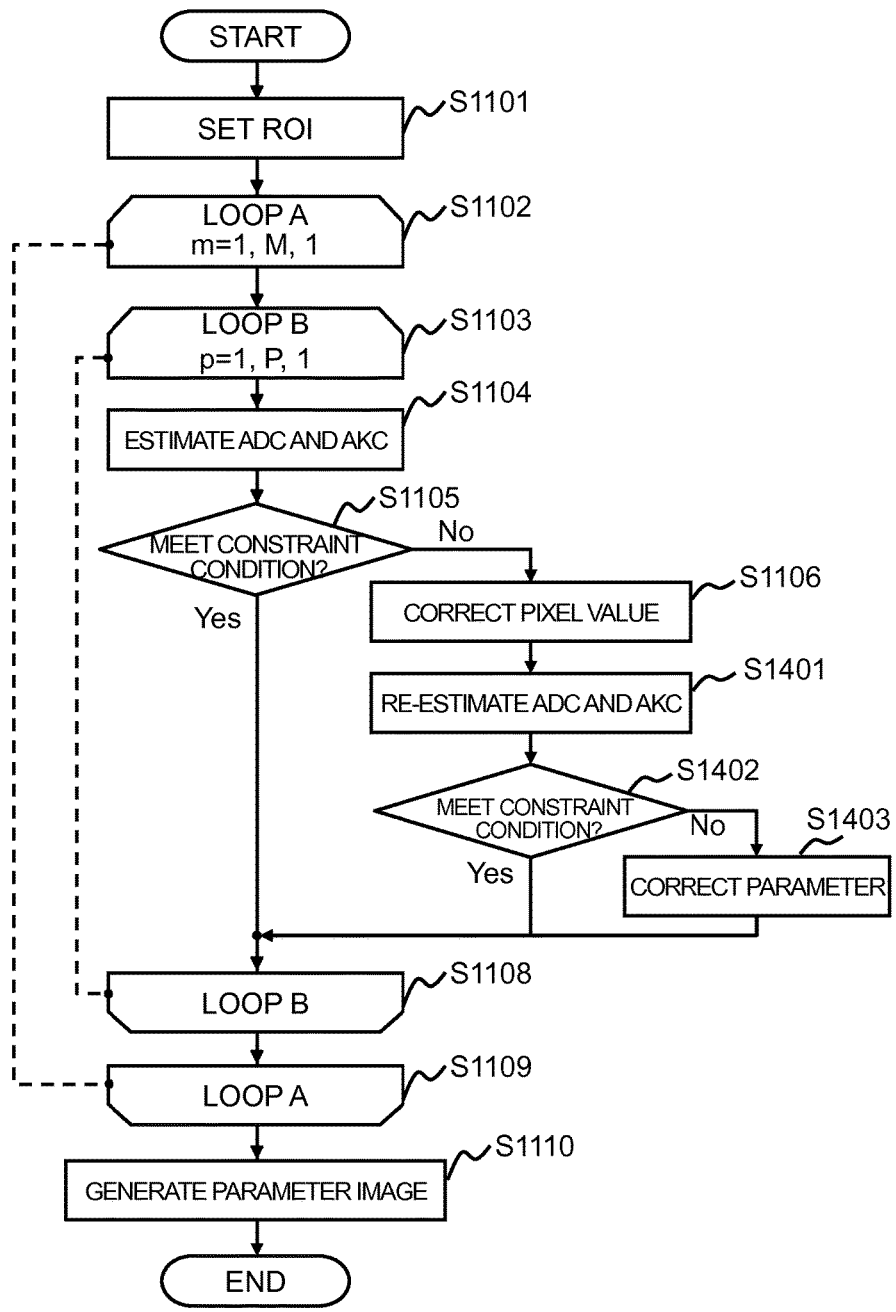
FIG. 8 is a flowchart of the image processing of the fourth embodiment.

Firstly, a flow of the image processing according to the image processor 220 of the present embodiment will be explained. FIG. 8 is a flow of the image processing of the present embodiment. Similar to the first embodiment, the application direction of the MPG pulse 303 is assumed as M, and the number of various b-values is assumed as N, and the number of pixels within the region of interest is assumed as P.

As illustrated, the region of interest is set, and within the region of interest being set, the diffusion parameter (diffusion coefficient $ADC_m$ and kurtosis coefficient $AKC_m$) is calculated for each pixel, with respect to each application direction of the MPG pulse 303. Then, it is determined whether or not the parameter meets the constraint condition, and if it is out of the range of the constraint condition, the processing for correcting the pixel value is performed. Up to this point, the present embodiment is the same as the first embodiment.

In the present embodiment, the parameter estimator 222 uses the corrected pixel value, to re-estimate the diffusion parameter (step S1401). On this occasion, the parameter estimator 222 of the present embodiment re-estimates the diffusion parameter according to the non-linear least square fitting without the constraint condition.

Thereafter, the discriminator 223 determines whether or not the re-estimated diffusion parameter meets the constraint condition (step S1402). If it is within the range of the constraint condition, the processing proceeds to the step S1108. If it is out of the range, the parameter corrector 226 corrects the parameter itself (step S1403). In this correction method, for instance, the parameter is replaced by a value satisfying the constraint condition, being the closest to the re-estimated diffusion parameter.

The subsequent processing is the same as the first embodiment.

Figure 9:
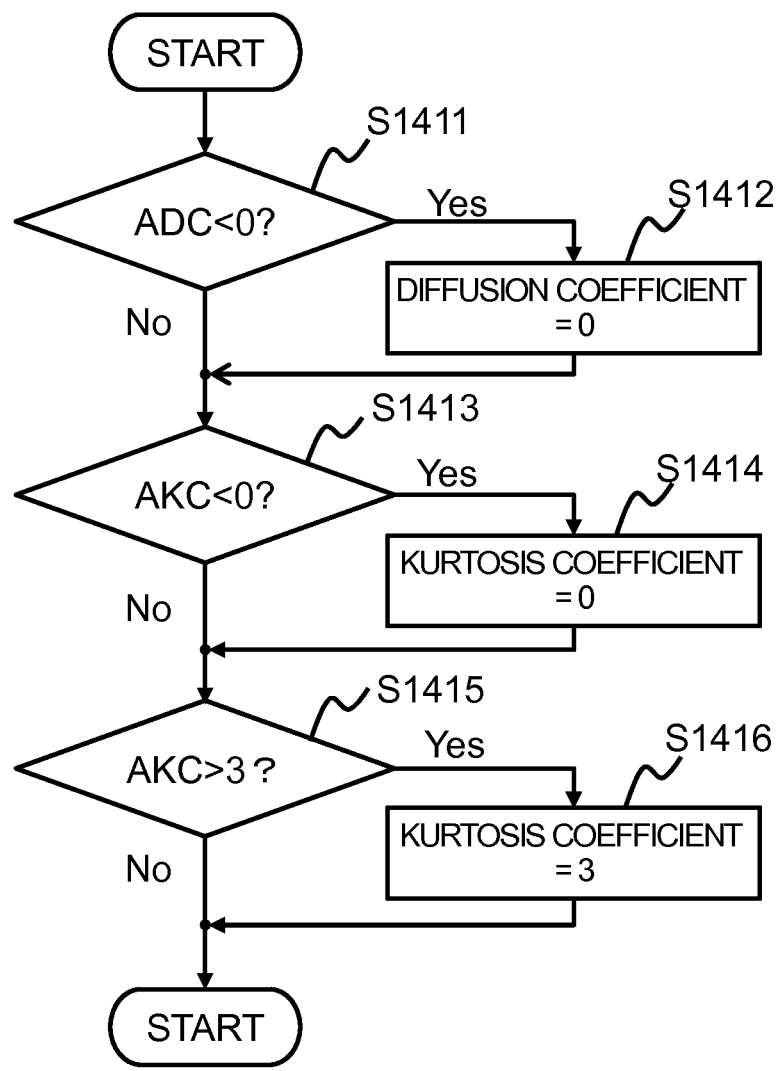
FIG. 9 is a flowchart of parameter correction processing of the fourth embodiment.

FIG. 9 illustrates a flow of the parameter correction process by the parameter corrector 226 in the step S1403. Firstly, when the estimated value of the diffusion coefficient $ADC_m$ is smaller than zero ($ADC_m<0$) (step S1411), the value of the diffusion coefficient $ADC_m$ is replaced by zero (step S1412). When the estimated value of the kurtosis coefficient $AKC_m$ is smaller than zero ($AKC_m<0$) (step S1413), the value of the kurtosis coefficient $AKC_m$ is replaced by zero (step S1414). When the estimated value of the kurtosis coefficient $AKC_m$ is larger than 3 ($AKC_m>3$) (step S1415), the value of the kurtosis coefficient $AKC_m$ is replaced by 3 (step S1416).

In the present processing, each determination process described above may be performed in any order.

The correction method according to the parameter corrector 226 is not limited to the method described above. It is also possible to configure such that the re-estimated diffusion parameter is corrected only by a correction value being predetermined. On this occasion, the correction value is determined in such a manner that this value allows all the diffusion parameters calculated for the respective pixels to fall into the range of the constraint condition.

Generally, the signal intensity (pixel value) S(m, b) in the formula (1) monotonically decreases, along with the increase of the b-value. However, when the variation of the signal intensity S(m, b) in association with the b-value is approximated by a quadratic function model being convex downward, upon approximation, there may be an extreme value within the range of the b-values used for the measurement. In such a case, the signal intensity S(m, b) turns to growth with the increase of the b-value. The parameter corrector 226 of the present embodiment corrects the parameter so as to avoid the case where such diffusion coefficient and kurtosis coefficient are calculated.

When the maximum b-value in the variations of the b-value is assumed as $b_{max}$, the b-value is only required to be the following; the b-value is equal to or smaller than $b_{max}$ and the signal intensity S(m, b) does not include an extreme value, and in other words, the b-value causing the signal intensity S(m, b) to be an extreme value is larger than the maximum b-value $b_{max}$. Following formula (20) restricts the diffusion coefficient $ADC_m$ and the kurtosis coefficient $AKC_m$.

$$b_{max} \leq \frac{3}{ADC_m \cdot AKC_m} \tag{20}$$

When the formula (20) is used as the constraint condition, it is not possible to perform simple replacement of values as the case of aforementioned parameter correction process. Therefore, on this occasion, the parameter corrector 226 corrects the diffusion coefficient $ADC_m$ and the kurtosis coefficient $AKC_m$ using an identical correction value $\Delta$, so that the values fall into the range of the constraint condition.

The correction value $\Delta$ is assumed as a value being smaller among the solutions of the following formula (21). Specifically, the following formula (22) gives the correction value.

$$b_{max}(ADC_m - \Delta) \cdot (AKC_m - \Delta) = 3 \tag{21}$$

$$\Delta = \frac{b_{max}(ADC_m + AKC_m) - \sqrt{b^2_{max} \cdot (ADC_m + AKC_m)^2 - 4b_{max}(b_{max}ADC_m AKC_m - 3)}}{2b_{max}} \tag{22}$$

As explained above, similar to the first embodiment, the MRI apparatus of the present embodiment is provided with the imager 210 configured to execute the diffusion weighted imaging sequence with varying the application direction and the b-value of the MPG pulse 303 so as to obtain plural diffusion weighted images, and the image processor 220, wherein the image processor 220 is provided with the ROI setter 221, the parameter estimator 222, the discriminator 223, the pixel value corrector 224, and the image generator 225. The MRI apparatus of the present embodiment is further provided with the parameter corrector 226 configured to correct the re-estimated diffusion parameter, wherein the parameter estimator 222 re-estimates the diffusion parameter from the corrected pixel value according to the least square fitting without the constraint condition, the discriminator 223 determines whether or not the re-estimated diffusion parameter is within the range of the constraint condition, and the parameter corrector 226 corrects the diffusion parameter being re-estimated, when a result of the determination indicates that the diffusion parameter is out of the range.

According to the present embodiment, a high-quality parameter image may be provided at high speed, as in the case of each embodiment described above. Further in the present embodiment, even though the parameter re-estimated after correcting the pixel value is out of the range of the constraint condition, the parameter is corrected so as to meet the constraint condition. This may allow a high-speed processing in the re-estimation using the corrected pixel value. Accordingly, much higher speed image processing may be executed.

In the present embodiment, it is also possible to use the linear least square fitting as in the case of the second embodiment, in the parameter estimation process of the step S1104 and in the parameter re-estimation process in the step S1401. Further in the correction process of the step S1106, the correction process according to the third embodiment may be performed.

Fifth Embodiment

Next, a fifth embodiment of the present invention will be explained. In the present embodiment, reliability of each pixel value of the obtained diffusion weighted images is calculated, and the calculated reliability is presented to the user.

Figure 10:
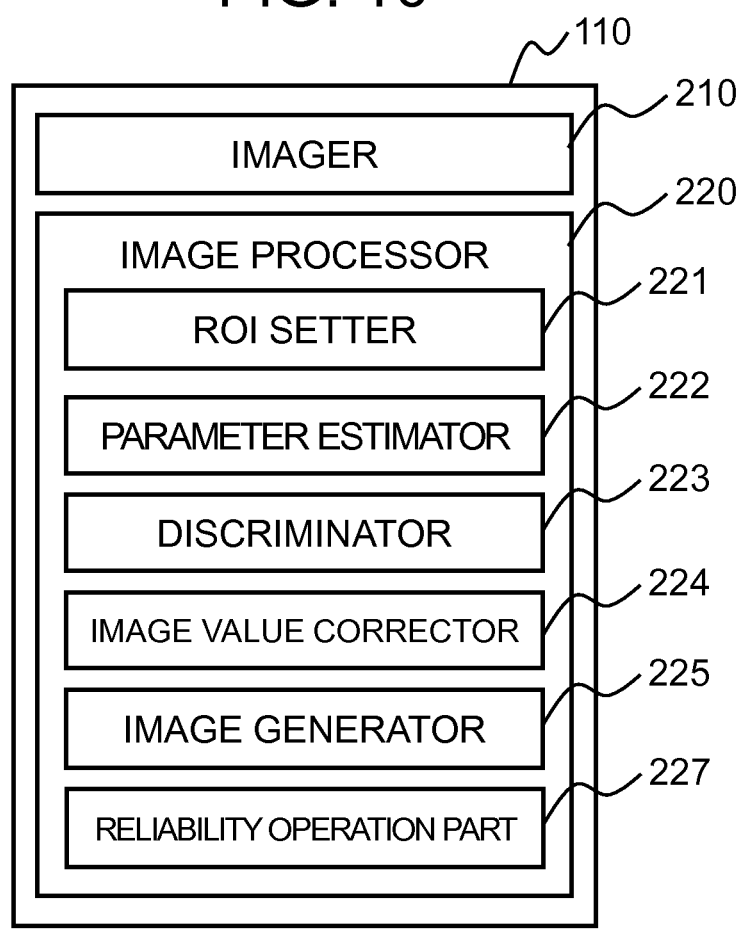
FIG. 10 is a functional block diagram of the computer of a fifth embodiment.

The MRI apparatus of the present embodiment has basically the same configuration as the MRI apparatus of the first embodiment. As illustrated in FIG. 10, in order to perform the aforementioned process, the image processor 220 of the present embodiment includes a reliability operation part 227 for obtaining the reliability of the computation upon computing the parameter image, in addition to the configuration of the first embodiment. Hereinafter, the present embodiment will be explained, focusing on the configuration that is different from the first embodiment.

In the image processor 220, the following flow of the processing is the same as the first embodiment; estimating the diffusion parameter (diffusion coefficient and kurtosis coefficient) from the plural diffusion weighted images obtained according to the DKI pulse sequence, and generating a parameter image by using the diffusion parameter.

The reliability operation part 227 of the present embodiment calculates the number of parameters determined as being within the range of the constraint condition, among the estimated diffusion parameters, and presents to the user, information obtained from the calculation result as a reliability indication. As the reliability, for instance, a ratio of the pixel count is calculated, the pixel count representing the number of the diffusion parameters being obtained without correcting the pixel value, among the diffusion coefficients and the kurtosis coefficients in each of the application directions of the MPG pulse 303. The calculation is performed by counting the pixels within the range of the constraint condition in the step S1105. In the step S1105, as far as the parameter meets the constraint condition, the reliability operation part 227 sets a flag on the pixel of the diffusion weighted image in the MPG pulse application direction, the flag indicating that the pixel is within the range of the constraint condition, and counts the number of pixels with the flag.

Figure 11:
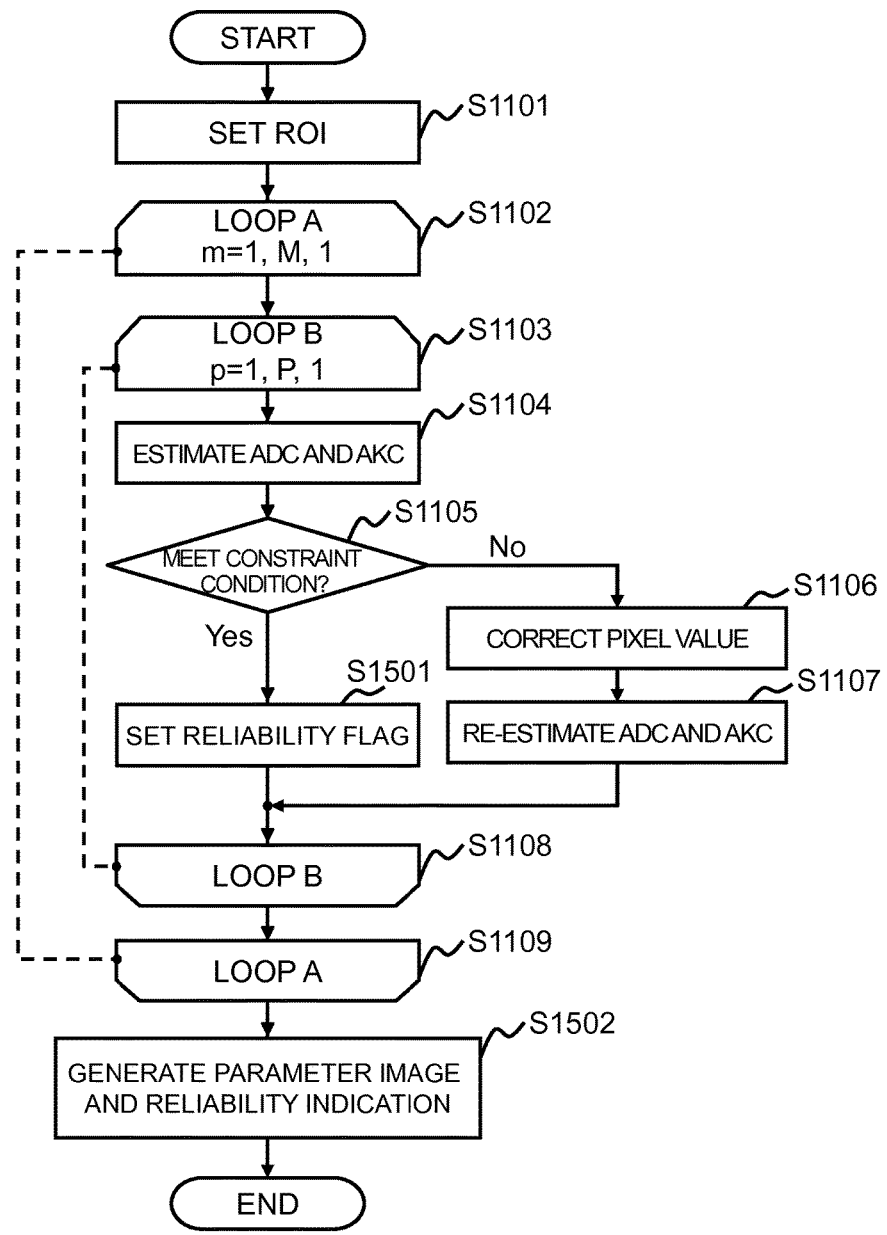
FIG. 11 is a flowchart of the image processing of the fifth embodiment.

FIG. 11 illustrates a flow of the image processing according to the image processor 220 of the present embodiment. Similar to the first embodiment, the application direction of the MPG pulse 303 is assumed as M, the number of various b-values is assumed as N, and the number of pixels in the region of interest is assumed as P.

As illustrated in FIG. 11, the parameter estimator 222 estimates the parameter (diffusion coefficient $ADC_m$ and kurtosis coefficient $AKC_m$) for each pixel within the region set as the region of interest by the ROI setter 221, and the discriminator 223 determines whether or not the estimated parameter is within the range of the constraint condition.

Then, if the parameter meets the constraint condition, the reliability operation part 227 sets the reliability flag Fr(m, p) on the pixel p in the MPG pulse application direction m (step S1501). Then, the process proceeds to the step S1108.

It is to be noted here that if the parameter does not meet the constraint condition in the step S1105, the processing is the same as the first embodiment.

Upon completing estimation of the parameters as to each of the pixels within the entire region of interest, for all the MPG pulse application directions, the image generator 225 generates a parameter image such as a mean diffusivity image and a mean kurtosis image using the estimated diffusion coefficient ADC and kurtosis coefficient AKC, similar to the first embodiment. In the present embodiment, on this occasion, the reliability operation part 227 generates a reliability indication (step S1502). The image processor 220 displays thus generated parameter image and reliability indication on the monitor 111.

In the present embodiment, as the reliability indication, for instance, there is calculated a ratio of the pixel count that satisfies the constraint condition, to the total number of the MPG pulse application directions M, as to each pixel p within the region of interest. It is to be noted that the reliability being calculated may be the pixel count itself. On this occasion, the reliability may be displayed using colors, being associated in advance with the calculated ratio (or the pixel count).

As explained above, similar to the first embodiment, the MRI apparatus of the present embodiment is provided with the imager 210 configured to execute the diffusion weighted imaging sequence while varying the application direction and the b-value of the MPG pulse 303 so as to obtain plural diffusion weighted images, and the image processor 220, wherein the image processor 220 is provided with the ROI setter 221, the parameter estimator 222, the discriminator 223, the pixel value corrector 224, and the image generator 225. The MRI apparatus is further provided with the reliability operation part 227 configured to calculate the number of parameters determined as meeting the constraint condition among the diffusion parameters being estimated, and present the user information obtained from a result of the calculation, as a reliability indication.

As described above, in the present embodiment, the diffusion parameter is estimated according to the least square fitting without the constraint condition, as in the case of the aforementioned embodiments, and correction is made only for the value that does not meet the constraint condition. Therefore, effects similar to those of the aforementioned embodiments may be produced. Further in the present embodiment, a ratio of the pixel count obtained without the correction is calculated and it is presented to the user.

As described above, correcting the pixel value by using the smoothing filter, for instance, may deteriorate the image quality. Showing the ratio of the pixel count the diffusion parameter of which is estimated as meeting the constraint condition without corrections, with respect to each of the pixels in the region of interest, allows the user to roughly grasp a degree of deterioration of each pixel in the parameter image. In other words, the user is allowed to grasp the influence of measurement errors on the measured data.

Therefore, according to the present embodiment, when a diagnosis is made by using thus obtained parameter image, it is possible to see the reliability, pixel by pixel, allowing the diagnosis to be conducted considering the degree of reliability in calculating a desired portion, and this may enhance the diagnostic performance.

It is to be noted that the pixels count is calculated, the diffusion parameter of which is estimated as meeting the constraint condition, for each application direction of the MPG pulse 303, and then, the ratio of the pixel count to the total number of pixels P within the region of interest may also be obtained as the reliability. Further in this example, the pixel count itself may be assumed as the reliability. On this occasion, a counter $CT_m$ may be provided for counting the number of pixels without corrections in the MPG pulse application direction m. In the aforementioned step S1501, together with setting the flag, or instead of setting the flag, the number of pixels without corrections in the application direction m may be counted.

It is further possible that information indicating whether or not the estimated diffusion parameter meets the constraint condition is calculated and displayed as the reliability, with respect to each MPG pulse application direction and with respect to each pixel.

Alternatively, the number of pixels determined as being out of the range of the constraint condition may be counted. On this occasion, in the step S1105, when it is determined as being out of the range of the constraint condition, a flag is set on the pertinent pixel of the diffusion weighted image in the pertinent MPG pulse application direction, indicating that the pixel is out of the range, before proceeding to the subsequent pixel processing. Then, by using this flag, either of the number of application directions in which the correction is made as to each pixel, or the number of pixels on which the correction is made as to each application direction, is calculated, and this may be displayed as the reliability. Flags may be provided respectively for the cases; within the range of the constraint condition and out of the range of the constraint condition.

The method of the present embodiment may be combined not only with the first embodiment, but this may also be combined with any of the second embodiment and the third embodiment.

What is claimed is:

1. A magnetic resonance imaging apparatus comprising,
an imager configured to perform magnetic resonance (MR) measurements according to a predetermined pulse sequence, and reconstruct one or more MR images therefrom;
an image processor configured to subject the one or more MR images being reconstructed to an arithmetic processing, and obtain one or more MR parameter images therefrom;
the predetermined pulse sequence also being a diffusion weighted MR imaging sequence that applies an MPG (motion probing gradient) pulse as part of the predetermined pulse sequence, the MPG pulse being configured to add signal variation along with a diffusion weighting onto a gradient magnetic field that is applied in order to generate nuclear magnetic resonance signals, wherein the imager executes the predetermined pulse sequence while also varying both an application direction and a b-value of the applied MPG pulse multiple times in order to thereby acquire plural MR images, and
wherein the image processor comprises:
a parameter estimator configured to estimate diffusion related parameters, including both a diffusion coefficient and a diffusion kurtosis coefficient;
whereby values of each of a plurality of pixels in the acquired plural MR images may represent any of either a mean diffusion, a mean kurtosis, an axial kurtosis, or a radial kurtosis; and
wherein the acquired values of each of these pixels are obtained by executing the predetermined pulse sequence, setting an identical direction of the applied MPG pulse and varying the b-value;
a discriminator component configured to make a determination concerning whether or not the pixel values of the diffusion related parameters being estimated are within a predetermined range;
a pixel value corrector that is configured to perform a correction on the values of the pixels in the acquired plural MR images when the result of the determination component indicates that the diffusion related parameters are out of the predetermined range, wherein the corrections of the pixel value corrector are applied only to the pixels that have values occurring outside of the predetermined range, and comprise:
either a pixel value smoothing, or
a pixel value removal, of the pixel values that are out of the predetermined range from the calculations being performed by the image processor; and
an image generator configured to generate the one or more MR parameter images by using the estimated diffusion related parameters that have been calculated by the processor for each of the pixels, where the estimated diffusion related parameters represent any of either a mean diffusion, a mean kurtosis, an axial kurtosis, or a radial kurtosis;
wherein, the parameter estimator estimates these diffusion related parameters according to a least square fitting without a constraint condition, and when the parameter estimator discriminator component indicates that the diffusion related parameters are out of the predetermined range, then the parameter estimator re-estimates the diffusion related parameters by using the corrected values of the pixels generated by the pixel value corrector, with the process being repeated until none of the pixel values of the diffusion related parameters, including both a diffusion coefficient and a diffusion kurtosis coefficient; are out of the predetermined range, and
wherein the image generator uses the re-estimated diffusion related parameters in producing the generated one or more MR parameter images.

2. The magnetic resonance imaging apparatus according to claim 1, wherein, a representative model function of the least square fitting without said constraint condition is a non-linear function.

3. The magnetic resonance imaging apparatus according to claim 1, wherein, a representative model function of the least square fitting without said constraint condition is a linear function.

4. The magnetic resonance imaging apparatus according to claim 3, wherein,
the pixel value corrector performs the correction by removing a pixel whose kurtosis coefficient is both outside of the predetermined range and negative in value, among pixels that are used in a parameter estimation performed by the parameter estimator, and
wherein the parameter estimator re-estimates the diffusion parameters by using only the remaining pixel values, those not removed by the pixel value corrector.

5. The magnetic resonance imaging apparatus according to claim 1, further comprising:
a parameter corrector configured to perform one or more corrections on the diffusion parameter that is being re-estimated,
wherein the parameter estimator re-estimates each of the diffusion parameters using the values of each of the pixels after the correction, according to the said least square fitting without the constraint condition,
wherein the discriminator makes a determination whether or not the re-estimated diffusion parameter is within the predetermined range, and
wherein the parameter corrector again corrects the re-estimated diffusion parameter, when the result of the determination indicates that the re-estimated diffusion parameter is out of the range, with the process being repeated until none of the pixel values of the diffusion related parameters, including both a diffusion coefficient and a diffusion kurtosis coefficient, are out of the predetermined range.

6. The magnetic resonance imaging apparatus according to claim 5, wherein,
the one or more corrections that are being performed by the parameter corrector are being performed in order to replace the diffusion parameter that is being re-estimated, with a second value within the predetermined range, with the second value being the closest value within the predetermined range, to the value of the diffusion parameter that is being re-estimated.

7. The magnetic resonance imaging apparatus according to claim 5, wherein,
the one or more corrections that are being performed by the parameter corrector is/are being performed in order to correct the diffusion parameter that is being re-estimated only by a predetermined correction value, and the predetermined correction value is determined by the parameter corrector so that all the diffusion parameters calculated for one pixel fall into the predetermined range.

8. The magnetic resonance imaging apparatus according to claim 1, further comprising,
a reliability operation performed within the pixel value corrector that calculates the number of diffusion parameters that are determined as being within the predetermined range, from among the total number of diffusion parameters being estimated, with that calculation being provided as a result to a given user, as a reliability indication the pixel values being obtained from the pixel value corrector.

9. The magnetic resonance imaging apparatus according to claim 1,
wherein the image processor further comprises an ROI setter configured to set a region of interest on the generated MR image, and
the parameter estimator estimates the diffusion parameters of the generated MR image by using values of the pixels occurring within the set region of interest.

10. The magnetic resonance imaging apparatus according to claim 1, wherein the pixel value corrector performs the correction by utilizing a pixel value smoothing filter.

11. The magnetic resonance imaging apparatus according to claim 1, wherein the parameter estimator assumes an initial pixel value for each of the diffusion parameters being estimated and then re-estimates those diffusion parameters according to a least square fitting with the constraint condition of claim 1 being applied.

12. An image processing apparatus comprising,
a parameter estimator configured to estimate diffusion related parameters, including both a diffusion coefficient and a diffusion kurtosis coefficient, whereby values of each of a plurality of pixels in an acquired plurality of MR images representing any of either a mean diffusion, a mean kurtosis, an axial kurtosis, or a radial kurtosis, and wherein the parameter estimator uses a value of a pixel in plural images obtained through a magnetic resonance imaging apparatus by executing a predetermined pulse sequence that applies an MPG (motion probing gradient) pulse as part of a predetermined pulse sequence, the MPG pulse being configured to add signal variation along with a diffusion weighting onto a gradient magnetic field that is applied in order to generate nuclear magnetic resonance signals while also varying both an application direction of the MPG pulse and a b-value of the applied MPG pulse multiple times in order to thereby acquire plural MR images, and estimate diffusion related parameters, including both a diffusion coefficient and a diffusion kurtosis coefficient with respect to each of the plurality of pixels;
a discriminator component configured to make a determination concerning whether or not the pixel values of the diffusion related parameters being estimated are within a predetermined range;
a pixel value corrector that is configured to perform a correction on the values of the pixels in the acquired plural MR images when the result of a determination component indicates that the diffusion related parameters are out of the predetermined range, wherein the corrections of the pixel value corrector are applied only to the pixels that have values occurring outside of the predetermined range and comprise:
either a pixel value smoothing, or
a pixel value removal, of the pixel values that are out of the predetermined range from the calculations being performed by an image processor, wherein the image processor is configured to subject the one or more MR images being reconstructed to an arithmetic processing and obtain one or more MR parameter images therefrom; and
an image generator configured to generate the one or more MR parameter images by using the estimated diffusion related parameters that have been calculated by the image processor for each of the pixels, where the estimated diffusion related parameters represent any of either a mean diffusion, a mean kurtosis, an axial kurtosis, or a radial kurtosis;
the parameter estimator estimates these diffusion related parameters according to a least square fitting process without the constraint condition, and when the parameter estimator discriminatory component indicates that the diffusion related parameters are out of the predetermined range, then the parameter estimator re-estimates the diffusion related parameters by using the corrected values of the pixels generated by the pixel value corrector, with the process being repeated until none of the pixel values of the diffusion related parameters, including both a diffusion coefficient and a diffusion kurtosis coefficient are out of the predetermined range, and wherein the image generator uses the re-estimated diffusion related parameters in producing the generated one or more MR parameter images.

13. An image processing method comprising,
using a value of a pixel in a plurality of plural images obtained through a magnetic resonance imaging apparatus by executing a predetermined pulse sequence that applies an MPG (motion probing gradient) pulse as part of a predetermined pulse sequence, the MPG pulse being configured to add signal variation along with diffusion weighting onto a gradient magnetic field that is applied in order to generate nuclear magnetic resonance signals while also varying both an application direction of the MPG pulse and a b-value of the applied MPG pulse multiple times in order to thereby acquire plural MR images, and estimate diffusion related parameters, including both a diffusion coefficient and a diffusion kurtosis coefficient with respect to each of a plurality of pixels;
determining whether or not the pixel values of the diffusion related parameters being estimated are within a predetermined range;
correcting the values of the pixels in the acquired plural MR images when the result of the determining indicates the diffusion related parameters are out of the predetermined range, wherein the corrections of the pixel values are applied only to the pixels that have values occurring outside of the predetermined range and comprise:
either a pixel value smoothing, or
a pixel value removal, of the pixel values that are out of the predetermined range;
re-estimating the diffusion related parameters by using values of the pixels after the correcting, with the process being repeated until none of the pixel values of the diffusion related parameters, including both a diffusion coefficient and a diffusion kurtosis coefficient are out of the predetermined range; and
using the re-estimated diffusion related parameters in producing the generated one or more MR parameter images.

14. A non-transitory computer readable media image processing program which contains instructions which when executed, causes a computer implementing said instructions to perform the processing steps of:

using a value of a pixel in a plurality of images obtained through a magnetic resonance imaging apparatus by executing a predetermined pulse sequence that applies an MPG (motion probing gradient) pulse as part of a predetermined pulse sequence, the MPG pulse being configured to add signal variation along with a diffusion weighting onto a gradient magnetic field that is applied in order to generate nuclear magnetic resonance signals, while also varying both an application direction of the MPG pulse and a b-value of the applied MPG pulse multiple times in order to thereby acquire plural MR images, and estimate a diffusion related parameters, including both a diffusion coefficient and a diffusion kurtosis coefficient with respect to each of a plurality of pixels;

determining whether or not the pixel values of the diffusion related parameters being estimated are within a predetermined range;

correcting the values of the pixels in the acquired plural MR images when the result of the determining indicates the diffusion related parameters are out of the predetermined range, wherein the corrections of the pixel values are applied only to the pixels that have values occurring outside of the predetermined range and comprise:

either a pixel value smoothing, or a pixel value removal, of the pixel values that are out of the predetermined range;

re-estimating the diffusion related parameters by using a values of the pixels after the correcting, with the process being repeated until none of the pixel values of the diffusion related parameters, including both a diffusion coefficient and a diffusion kurtosis coefficient are out of the predetermined range; and using the re-estimated diffusion related parameters in producing the generated one or more MR parameter images.

* * * * *